US006452387B1

(12) United States Patent
Hargreaves et al.

(10) Patent No.: US 6,452,387 B1
(45) Date of Patent: Sep. 17, 2002

(54) CATALYZING THE TRANSIENT RESPONSE IN STEADY-STATE MRI SEQUENCES

(75) Inventors: Brain A. Hargreaves; Shreyas Vasanawala, both of Stanford; John M. Pauly, Redwood City; Dwight G. Nishimura, Palo Alto, all of CA (US)

(73) Assignee: Board of Trustees of the Leland Stanford Junior University, Palo Alto, CA (US)

(*) Notice: Subject to any disclaimer, the term of this patent is extended or adjusted under 35 U.S.C. 154(b) by 8 days.

(21) Appl. No.: 09/801,424

(22) Filed: Mar. 7, 2001

(51) Int. Cl.[7] .................................................. G01V 3/00
(52) U.S. Cl. ........................................ 324/300; 324/307
(58) Field of Search ................................... 324/300–322

(56) References Cited

PUBLICATIONS

"Characterization and Reduction of the Transient Response in Steady–State MR Imaging" by Brian A. Hargreaves, Shreyas S. Vasanawala, John M. Pauly, and Dwight G. Nishimura Magnetic Resonance in Medicine vol. 46 pp. 149–158 Jul. 2001.*
Deimling et al., "Magnetization Prepared True FISP Imaging, "Proceedings of the 2nd Annual Meeting of SMR, San Francisco, 1994, p. 495.
Nishimura et al., "Analysis and Reduction of the Transient Response in SSFP Imaging," Proceedings of the 8th Annual Meeting of ISMRM, Denver, Apr. 1, 2000, p. 301.
Pauly et al., "Parameter Relations for the Shinnar–Le Roux Selective Excitation Pulse Design Algorithm," IEEE Trans Med Imaging, vol. 10, No. 1, 1991, pp. 53–54.
Vasanawala et al., "Fluctuating Equilibrium MRI, " Magnetic Resonance in Medicine, 42:876, 1999, 2 pp.
Vasanawala et al., "Linear Combination Steady–State Free Precession MRI," Magnetic Resonance in Medicine, 43:82, Jan. 2000, 2 pp.

* cited by examiner

*Primary Examiner*—Edward Lefkowitz
*Assistant Examiner*—Tiffany A. Fetzner
(74) *Attorney, Agent, or Firm*—Townsend and Townsend and Crew LLP; Henry K. Woodward

(57) ABSTRACT

A steady-state condition for tipped nuclear spins is accelerated or catalyzed by first determining magnetization magnitude of the steady state and the scaling magnetization along one axis (Mz) to at least approximate the determined magnetization magnitude. Then the scaled magnetization is rotated to coincide with a real-valued eigenvector extension of the tipped steady-state magnetization. Any error vector will then decay to the steady-state condition without oscillation. In one embodiment, the magnetic resonance imaging utilizes steady-state free precession (SSFP). The scaling and rotating steps are followed by the steps of applying read-out magnetic gradients and detecting magnetic resonance signals from the tipped nuclear spins. The magnetization magnitude is determined by eigenvector analysis, and the eigenvector extension is a real-valued eigenvector determined in the analysis.

27 Claims, 16 Drawing Sheets

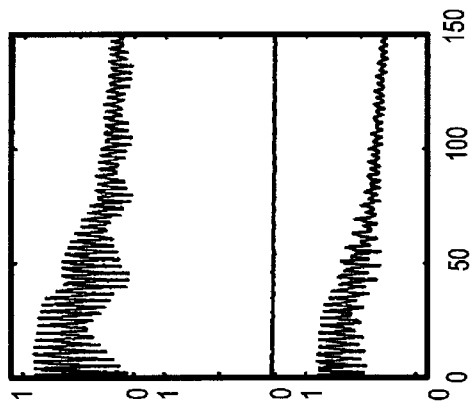
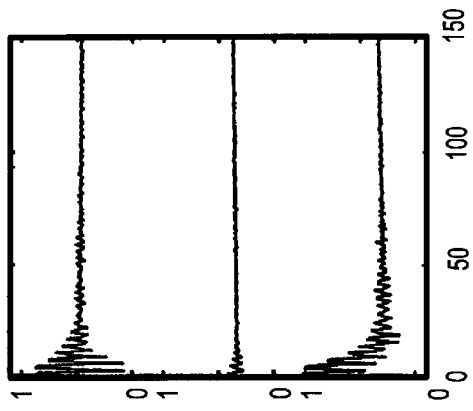
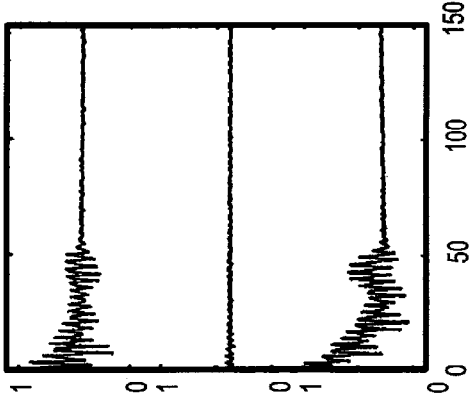
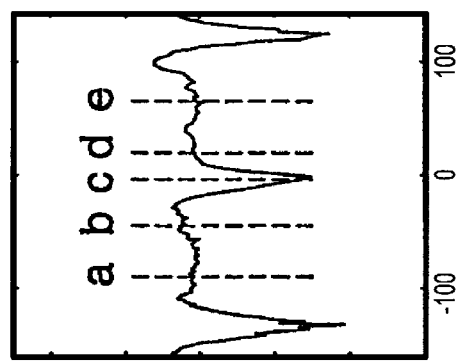
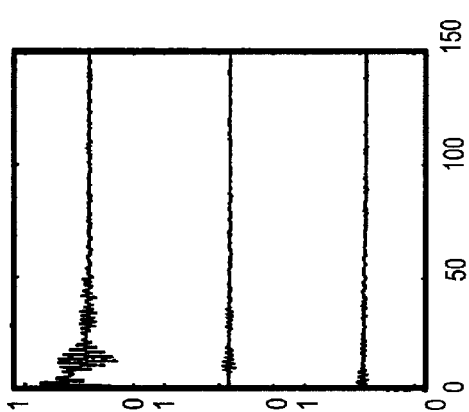
FIG. 10A  FIG. 10B  FIG. 10C
FIG. 10D  FIG. 10E  FIG. 10F

*FIG. 11A*          *FIG. 11B*
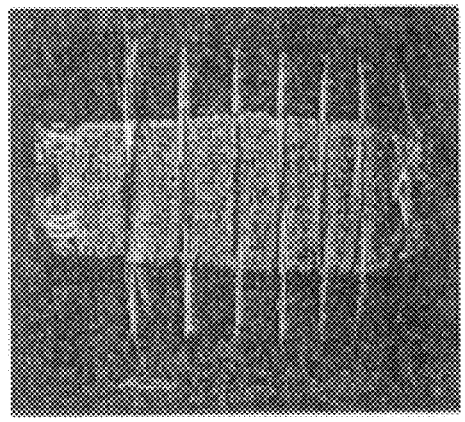 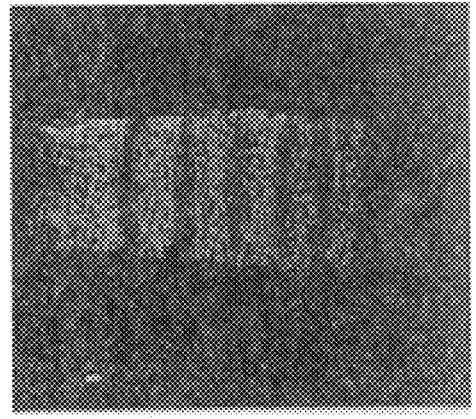
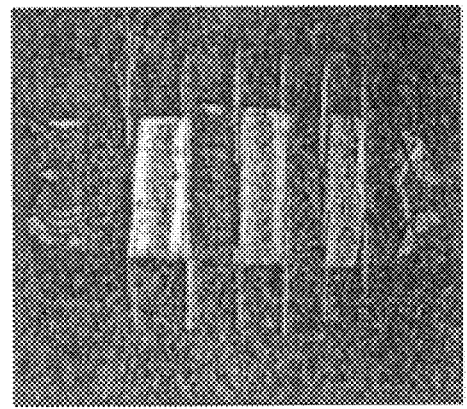 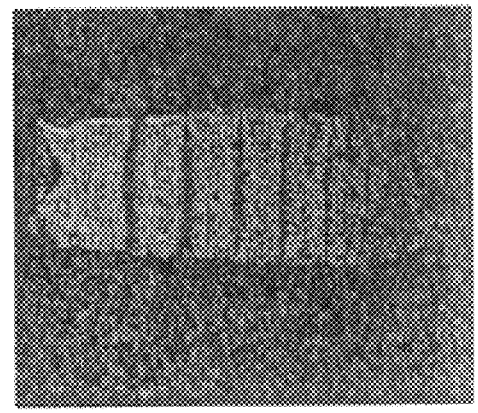
Readout ⟶
Phase Encode ⟶
*FIG. 11C*          *FIG. 11D*

CATALYZING THE TRANSIENT RESPONSE IN STEADY-STATE MRI SEQUENCES

The U.S. government has rights in the claimed invention pursuant to NIH grants to Stanford University, NIH HL39297, NIH HL56394, NIH AR46904 and NIH CA50948.

BACKGROUND OF THE INVENTION

This invention relates generally to magnetic resonance imaging (MRI), and more particularly, the invention relates to steady-state magnetic resonance imaging sequences and a method of establishing nuclear magnetization in a steady-state position to thereby accelerate MRI signal acquisition.

Magnetic resonance imaging (MRI) is a non-destructive method for the analysis of materials and represents a new approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Magnetic resonance (MR) imaging is based on nuclear spins, which can be viewed as vectors in a three-dimensional space. During a MR experiment, each nuclear spin responds to four different effects—precession about the main magnetic field, nutation about an axis perpendicular to the main field, and both transverse and longitudinal relaxation. In steady-state MR experiments, a combination of these effects occurs periodically.

Refocused steady-state free precession (SSFP) sequences have recently gained popularity in magnetic resonance imaging, due to improved gradient hardware. One drawback with such sequences is the slow and often oscillatory signal progression as a steady-state is established, as shown in FIG. 1a. Imaging during this transient period can result in image artifacts. Alternatively, waiting for a steady-state reduces the scan-time efficiency of the method. An objective of the present invention is to "catalyze " or speed up the evolution of a steady-state as in FIG. 1b. An ideal catalyzing sequence would achieve the steady-state much more quickly and with no oscillation.

The steady-state nuclear magnetization in steady-state sequences is a non-trivial function of many parameters. The present invention is directed to generating a sequence that catalyzes the steady-state magnetization based on the steady-state and the transient response in MRI sequences.

SUMMARY OF THE INVENTION

In accordance with the invention, a steady-state condition for tipped nuclear spins is accelerated or catalyzed by first determining magnetization magnitude of the steady-state and then scaling magnetization along one axis (Mz) to at least approximate the determined magnetization magnitude. Then the scaled magnetization is rotated to substantially coincide with a real-valued eigenvector extension of the tipped steady-state magnetization. Any error vector will then decay to the steady-state condition with reduced oscillation.

In one embodiment, the magnetic resonance imaging utilizes steady-state free precession (SSFP). The scaling and rotating steps are followed by the steps of applying read-out magnetic gradients and detecting magnetic resonance signals from the tipped nuclear spins. The magnetization magnitude is determined by eigenvector analysis, and the eigenvector extension is a real-valued eigenvector determined in the analysis.

The invention and objects and features thereof will be more readily apparent from the following description and appended claims when taken with the drawings.

BRIEF DESCRIPTION OF THE DRAWINGS

FIGS. 10a–10e illustrate experimental transient responses, and FIG. 10f illustrates positions of the five frequencies in FIGS. 10a–10e.

FIG. 11 illustrates images using different SSFP sequences.

DESCRIPTION OF THE SPECIFIC EMBODIMENTS

Figure 1A:
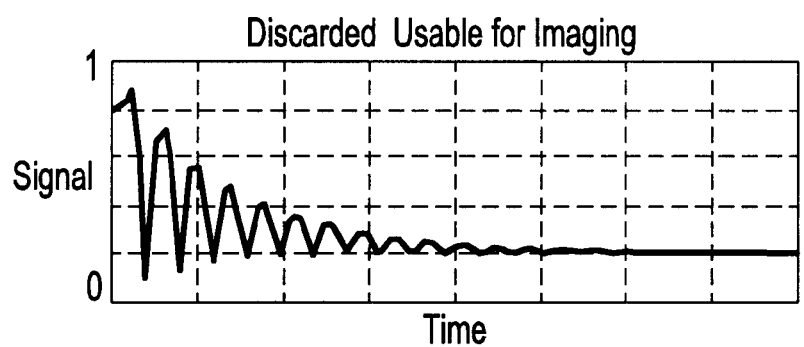
FIG. 1a illustrates a normal SSFP transient response with slow decay and oscillation.
Figure 1B:
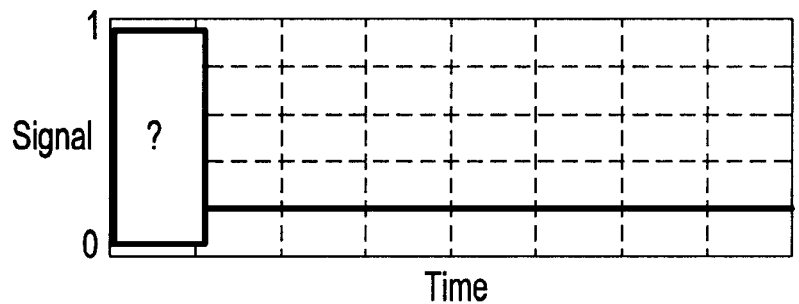
FIG. 1b illustrates an ideal catalyzing sequence to more quickly achieve steady-state with no oscillation.

Before describing a specific embodiment of the invention, consider first a steady-state signal.

In any periodic sequence of RF excitations and gradients, the magnetization change from one period to the next can be expressed in the form of a discrete-time system:

$$M_{k+1} = AM_k + B \quad [1]$$

where $M_k$ is a 3×1 vector representing the magnetization ($M_x$, $M_y$, $M_z$) at the $k^{th}$ period. B is a 3×1 vector and A is a 3×3 matrix. Typically A and B are functions of $T_1$, $T_2$ and various rotation and precession angles. In the steady-state, $M_{k+1} = M_k = M_{ss}$ and Eq. 1 is easily solved for the steady-state magnetization, $M_{ss}$:

$$M_{ss} = (I-A)^{-1} B \quad [2]$$

Where I is the 3×3 identity matrix. The derivation of A and B is relatively simple for most sequences, and will be shown for a refocused SSFP sequence shortly.

The transient response is the magnetization during the initial period of a sequence during which steady-state magnetization evolves from a particular initial condition. The length and character of the transient response depends on A, B, and the initial condition, $M_0$. Here we will show that the transient response can be viewed as the zero-input response of a third-order linear system.

Equation 2 can be rearranged as $M_{ss}=AM_{ss}+B$, and subtracted from Eq. 1 to give $$M_{k+1}-M_{ss}=A(M_k-M_{ss}) \quad [3]$$

With the substitution, $Q_k=M_k-M_{ss}$, this is simply $$Q_{k+1}=AQ_k \quad [4]$$

$Q_k$ is the transient magnetization for the $k^{th}$ excitation; that is, the difference between $M_k$ and the steady-state magnetization. As the magnetization reaches steady-state, $Q_k$ approaches zero. Equation 4 describes the zero-input response of a third order linear system, which can be analyzed using eigenvalue decomposition or z-transform methods.

Equation 4 is more useful when we use the eigenvector decomposition of the matrix A to write $$A=V\Lambda V^{-1} \quad [5]$$

where $\Lambda$ is a 3×3 diagonal matrix of the eigenvalues $\lambda_i$, of A and the columns of the 3×3 matrix V are the eigenvectors $v_i$, of A.

A positive, real-valued eigenvalue will correspond to a purely exponential transient response, while complex-valued or negative real-valued eigenvalues correspond to decaying oscillatory responses. Because M is a real-valued vector, any complex eigenvalues of A will occur in complex-conjugate pairs. Since there are three eigenvalues, at least one must be real-valued, and the corresponding eigenvector must also be real-valued. The magnetization described by Eq. 1 is a stable system, implying that all eigenvalues have magnitude less than unity.

Using the eigenvector decomposition, $$Q_k = V\Lambda^k V^{-1} Q_0 \quad [6]$$

$$Q_k = \sum_{i=1}^{3} \beta_i \lambda_i^k v_i \quad [7]$$

where $\beta = V^{-1}Q_0$ is a 3×1 vector that gives the components of $Q_0$ along each eigenvector. Hence $Q_k$ can be expressed as a linear combination of the eigenvectors of A. The component of $Q_0$ along a given eigenvector decays according to the corresponding eigenvalue.

If $Q_0$ is directed along one eigenvector of A, that is $Q_0=\beta v_i$, where $\beta_i$ is the $i^{th}$ scalar element $\beta$, then the entire transient response will be directed along that eigenvector; i.e., $$Q_k=\beta_i \lambda_i^k v_i \quad [8]$$

Figure 2:
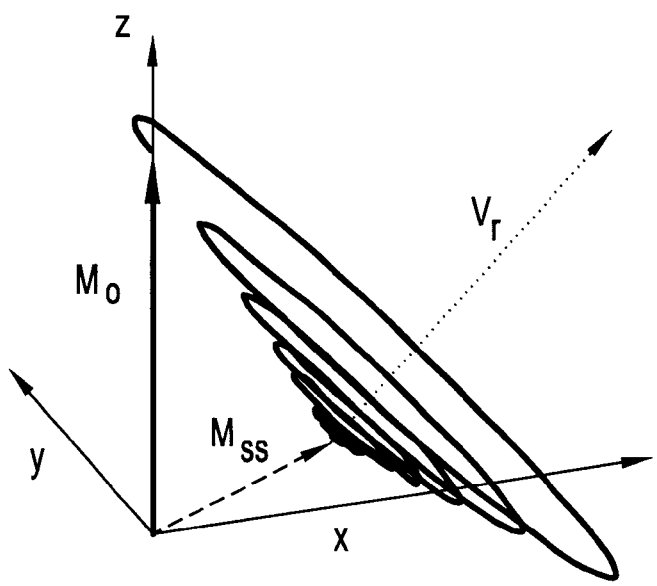
FIG. 2 illustrates transient response of magnetization.

For many cases, we can assume that only one of the eigenvalues is real-valued. If we denote this eigenvalue $\lambda_r$ and the corresponding eigenvector $v_r$, then when $Q_0$ is directed along $v_r$, the transient response is purely exponential, rather than oscillatory. This is a highly desirable condition, as oscillations in the transient response tend to cause serious artifacts in images. FIG. 2 shows a sample transient response from $M_0$ to $M_{ss}$. The real-valued eigenvector, $v_r$, is shown. The component along $v_r$ decays linearly, while the component orthogonal to $v_r$ decays along a spiral pathway in a plane orthogonal to $v_r$.

The matrix A is the product of rotation and diagonal matrices which represent nutations, precessions and decays. It can be shown that A is a normal matrix; that is, $A^H A = AA^H$, where $A^H$ is the hermitian-transpose of the matrix A.

The eigenvectors of normal matrices are always orthogonal. This orthogonality means that the oscillatory component of the transient response is always in a plane perpendicular to the real-valued eigenvector, and the path in the plane is a circular (rather than elliptical) spiral.

There is also a strong relationship between the steady-state magnetization and the eigenvalue decomposition of A. Substituting Eq. 5 into Eq. 2, we can write $$M_{ss}=V(I-\Lambda)^{-1}V^{-1}B \quad [9]$$

The product $V^{-1}B$ transforms B into its components along each eigenvector. The diagonal matrix $(I-\Lambda)^{-1}$ scales each component. Finally, the premultiplication by V transforms back to the Cartesian coordinate system. If one of the eigenvalues is much closer to 1 than the others, then the corresponding element of $(I-\Lambda)^{-1}$ will dominate. Assuming there is a reasonable component of B along the eigenvector for the eigenvalue close to 1, the result is that $M_{ss}$ lies almost parallel to the eigenvector. This is often true for steady-state MRI sequences.

The preceding analysis applies to general periodic MR imaging sequences. Here we examine the steady-state and transient responses for refocused-SSFP sequences, as an example, and to gain some intuition before designing a catalyzing sequence for refocused-SSFP.

Figure 3:
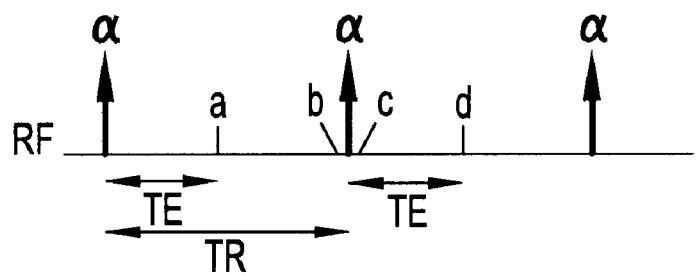
FIG. 3 illustrates a refocused SSFP sequence consisting of an RF excitation which is repeated periodically.

We use a simple propagation approach to derive the steady-state magnetization for SSFP imaging sequences, shown in FIG. 3. This approach can be used for any periodic sequence. A refocused SSFP sequence consists of a single RF excitation which is repeated periodically. All gradients used for slice selection or imaging are fully rewound over each repetitive time, TR. In the steady-state, the magnetization at points a and d is the same.

Magnetization is tipped about the x-axis through an angle $\alpha$. Between excitations, the magnetization undergoes a precession by an angle $\theta=2\pi\Delta f TR$ about the z-axis, where f is the tissue off-resonance, and also experiences both $T_1$ and $T_2$ relaxation.

During the sequence each spin is affected by RF pulses, relaxation and free precession. We represent the RF nutation about the x-axis of an angle $\alpha$ by a multiplication by the matrix $$R_\alpha = \begin{bmatrix} 1 & 0 & 0 \\ 0 & \cos\alpha & \sin\alpha \\ 0 & -\sin\alpha & \cos\alpha \end{bmatrix} \quad [10]$$

Similarly, free precession over a period $\tau$ corresponds to a multiplication by the rotation matrix $$P(\tau) = \begin{bmatrix} \cos(2\pi\Delta f\tau) & \sin(2\pi\Delta f\tau) & 0 \\ -\sin(2\pi\Delta f\tau) & \cos(2\pi\Delta f\tau) & 0 \\ 0 & 0 & 1 \end{bmatrix} \quad [11]$$

Finally, $T_1$ and $T_2$ relaxation over a time $\tau$ can be represented by a multiplication by the matrix $$C(\tau) = \begin{bmatrix} e^{-\frac{\tau}{T_2}} & 0 & 0 \\ 0 & e^{-\frac{\tau}{T_2}} & 0 \\ 0 & 0 & e^{-\frac{\tau}{T_2}} \end{bmatrix} \quad [12]$$

and an addition of the vector $$D(\tau) = (I - C(\tau)) \begin{bmatrix} 0 \\ 0 \\ m_o \end{bmatrix} \quad [13]$$

Using this formulation, the magnetizations in FIG. 3 are related by $M_b = P(TR-TE)C(TR-TE)M_a + D(TR-TE)$ $M_c = R_a M_b$ $M_d = P(TE)C(TE)M_c + D(TE)$ [14].

If we let $M_k$ represent $M_a$ on the $k^{th}$ excitation, then $M_{k+1}$ and $M_k$ are related in the same way as $M_d$ and $M_a$. Simplifying Eqs. 14 gives:

$M_{k+1} = P_1 C_1 R_a P_2 C_2 M_k + P_1 C_1 R_a D_2 + D_1$ [15]

where $P_1 = P(2\pi \Delta f TE)$ $P_2 = P(2\pi \Delta f (TR-TE))$ $C_1 = C(TE)$ $C_2 = C(TR-TE)$ $D_1 = D(TE)$ $D_2 = D(TR-TE)$ [16].

By defining $A = P_1 C_1 R_a P_2 C_2$ and $B = P_1 C_1 R_a D_2 + D_1$, Eq. 15 can be simplified to Eq. 1.

The derivation of Eq. 15 shows that the steady-state magnetization for SSFP is a function of the sequence parameters flip angle (a), repetition time (TR) and echo time (TE) as well as the tissue parameters $T_1$, $T_2$, and off-resonant frequency $\Delta f$.

Figure 4:
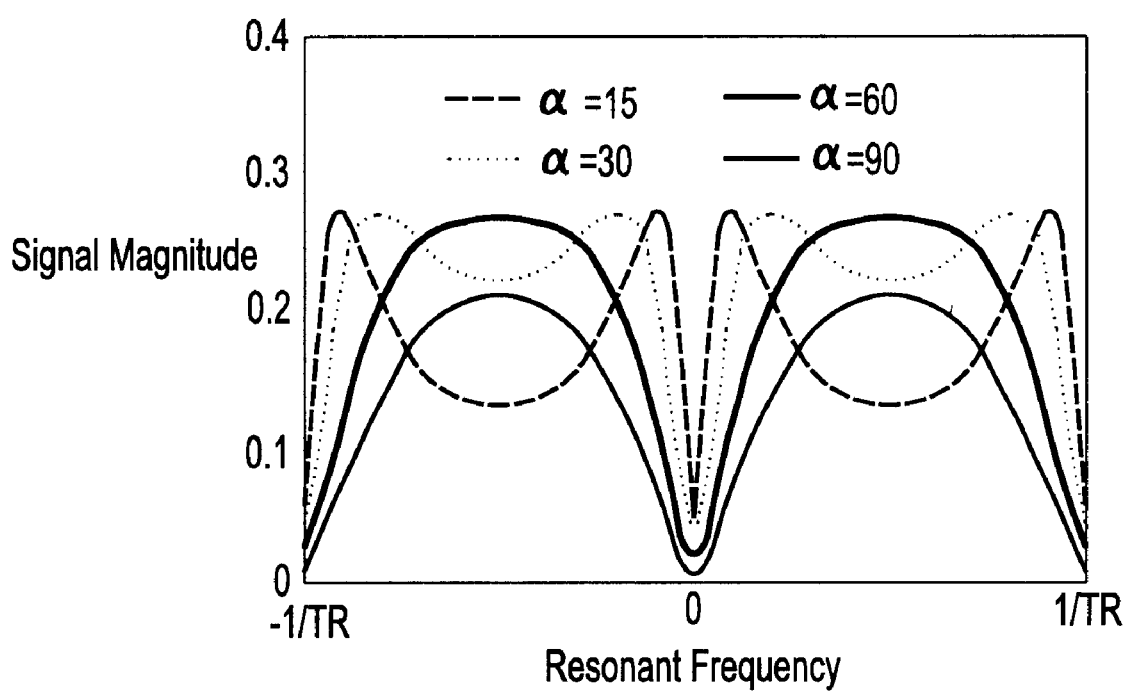
FIG. 4 illustrates spectral response of an SSFP sequence.

The steady-state SSFP signal magnitude is periodic with respect to resonant frequency with a period of 1/TR, as shown in FIG. 4. The phase of the signal is also periodic if the echo time is a rational fraction of TR, with a period equal to the lowest common multiple of 1/TR and 1/TE. In FIG. 4, the signal magnitude at TE=TR/2 is shown for $T_1$=400 ms, $T_2$=100 ms and TR=10 ms. The signal level is quite sensitive to flip angle, as shown in the plot. The magnitude is periodic in frequency with a period of 1/TR.

Incrementing the phase of the RF excitation has the result of shifting the SSFP spectral response along the resonant-frequency axis, the identical effect as changing the exciter frequency. This concept has been used in SSFP imaging, where the phase of the RF excitation is incremented by 180 on each excitation. Additionally, Linear Combination SSFP is a technique that combines data acquired using different RF-phase-cycling schemes either to flatten the overall SSFP magnitude response or to achieve fat-water separation in multiple sets of images. To simplify the analysis herein, no RF-phase-cycling is assumed in the SSFP sequences.

The goal of a catalyzing method is to minimize the time required to reach a point where signal is useful for imaging. Oscillations or large signal changes during the transient response reduce the usefulness of the signal, as they can result in varied contrast or image artifacts. Ideally, a catalyzing sequence puts the magnetization directly to its steady-state position in as short a time as possible. However, as with other pulse design, catalyzing sequence design involves a tradeoff between accuracy, pulse duration and practical considerations.

The solution according to our invention is to manipulate the magnetization vector for each resonant frequency so that it is close to the steady-state magnetization in both magnitude and direction, and so that the error vector between the actual and steady-state magnetization vectors is as nearly as possible directed along the real-valued eigenvector. The latter condition, when met, ensures that the error vector will decay without oscillation. This solution consists of two stages—magnitude scaling and direction selection, illustrated in FIGS. 5a–5c and FIGS. 5d–5f. In FIG. 5, the initial magnetization $M_0$ (a) is rotated so that the residual component along the z-axis is equal to $|M_{ss}|$, as in (b). A crusher gradient leaves only the z-component of the magnetization, so that ideally it is scaled to its steady-state length. For direction selection, we start with an imperfectly scaled magnetization, $M_I$, as in (d). This magnetization is rotated in (e) to $M_{des}$, which differs from $M_{ss}$ along the real-valued eigenvector of the matrix A. The magnetization will then decay along $v_r$ to $M_{ss}$ (f). In the case where either $v_r$ lies along $M_{ss}$, or when $|M_I|=|M_{ss}|$, the direction selection simply rotates the magnetization from the z-axis to the steady-state direction.

The magnitude scaling and direction selection pulses are complicated by the fact that the steady-state magnetization vector, as well as the direction of the eigenvectors of the matrix A vary considerably with the resonant frequency. The pulses must be designed to e spectrally selective so that they simultaneously catalyze the steady-state for all resonant frequencies.

Ideally, simply rotating the magnetization to the desired direction will eliminate oscillations in the transient response of steady-state sequences. However, there are several reasons for first performing some type of magnitude scaling. First, the magnitude can be slow in decaying to the steady-state value. Second, small errors in direction are amplified by the magnitude difference resulting in the type of oscillations that the direction selection is designed to reduce. Third, for SSFP sequences we will see that a magnitude scaling pulse can improve the performance of the direction selection pulse described below. Fourth, in SSFP sequences, the on-resonance magnetization transient is large, but steady-state magnitude is small. Nulling this magnetization eliminates this transient behavior.

Figure 5A:
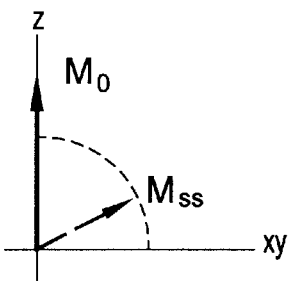
FIGS. 5a–5c illustrate magnetization magnitude scaling.
Figure 5B:
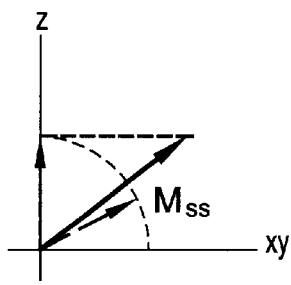
Figure 5C:
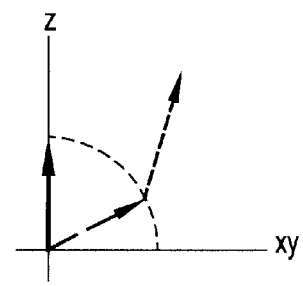
Figure 5D:
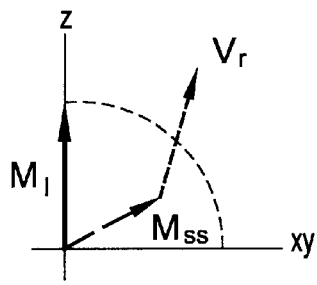
FIGS. 5d–5f illustrate direction selection in accordance with an embodiment of the invention.
Figure 5E:
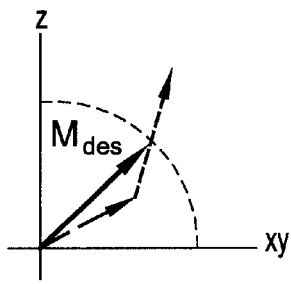
Figure 5F:
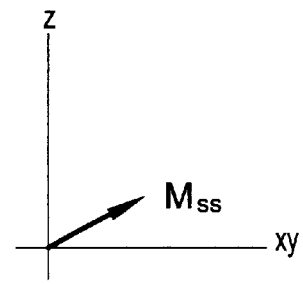

The sequence used for magnitude-scaling depends on the steady-state magnetization length. A spectrally-selective tip followed by a crusher pulse results in spectrally-selective scaling of the magnetization and leaves all magnetization along the z-axis (FIG. 5c). The cosine of the tip angle should be approximately equal to the steady-state magnetization length.

Figure 6:
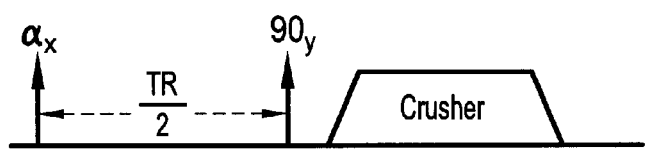
FIG. 6 illustrates a magnitude scaling sequence.

It is possible to design spectrally-selective RF pulses to approximate any profile, as will be discussed subsequently. For SSFP, a simpler design is achieved by noting that $|M_{ss}| \approx \alpha \sin(\pi \Delta f TR)$. This magnetization profile is easily generated with the magnitude scaling sequence shown in FIG. 6. The $\alpha_x$ pulse tips the desired peak magnetization into the transverse plane. After TR/2 the 90y pulse brings this magnetization along the longitudinal axis. A crusher pulse spoils remaining transverse magnetization. This results in the scaled magnetization, $M_{mag}$, as $$M_{mag} = \begin{bmatrix} 0 \\ 0 \\ \sin\alpha \sin(\pi \Delta f TR) \end{bmatrix} \quad [17]$$

Once the magnitude scaling has been performed, the direction selection pulse can be designed.

The ideal catalyzing sequence directs and scales the magnetization to be equal to $M_{ss}$. Consider now what is the best way to direct magnetization from a starting point, $M_I$. We will treat the general case of arbitrary $M_I$, although $M_I$ is typically directed along the $M_z$ axis.

We have shown that the magnetization will decay without oscillation if the transient is directed along a real-valued eigenvector of the A-matrix. The desired magnetization, $M_{des}$, satisfies $$M_{des} = M_{ss} + av_r \quad [18]$$

under the constraint that $$|M_{des}| = M_I \quad [19]$$

where $v_r$ is a real-valued eigenvector of the A-matrix, and $\alpha$ is a scalar. The relationship between $M_I$, $M_{ss}$, $M_{des}$ and $v_r$ is shown in FIG. 5(d–e). Ideally, we could achieve $M_{des}$ for every $T_1$, $T_2$ and f, but $T_1$- and $T_2$-selective RF pulses would have a very long time duration.

In many sequences, $M_{ss}$ and the $v_r$ direction are not very sensitive to $T_1$ and $T_2$, although they are highly sensitive to off-resonance frequency, f. Using Eqs. 18 and 19 we obtain $M_{des}(f)$, the desired magnetization as a function of f. We then design a frequency-selective RF pulse that attempts to achieve the desired magnetization direction. The RF pulse is designed using the Shinnar-Le Roux (SLR) Selective Pulse Design Algorithm, as described by Pauly J, Le Roux P, Nishimura D, Macovski A, "Parameter relations for the shinnar-le roux selective excitation pulse design algorithm," IEEE Trans Med Imaging, 1991. The SLR algorithm provides a structured approach to obtain an RF pulse from a desired profile of rotation angles (both elevation and azimuthal angle). The details of this pulse design are included herein. The SLR algorithm designs a pulse which is not causal, so a 180° refocusing pulse is included in the design and the desired magnetization is achieved at the resulting spin echo. Briefly, the SLR algorithm allows design of more precise pulses than simpler "small-tip-angle" approaches. Both methods attempt to generate a profile of flip angle as a function of resonant frequency.

Beginning with the flip angle profile, $\theta$ ($\Delta f$), and the azimuthal angle profile, $\phi(\Delta f)$, we choose polynomials A(z) and B(z) with $z = e^{i\pi \Delta f TR}$ such that $$A(z) = \epsilon^{i\phi} \cos \theta/2 \quad [20]$$

$$B(z) = \sin \theta/2 \quad [21]$$

If the desired profiles $\phi$ and $\theta$ are generated for frequencies between $-1/TR$ and $1/TR$, then a discrete Fourier transform can be used to determine the coefficients of A(z) and B(z). The A(z) and B(z) polynomials are then truncated to include just a few dominant coefficients. The SLR transform then gives the appropriate RF pulse.

To achieve the phase profile for which the RF pulse is designed usually requires a spin-echo, since the RF pulse is non-causal. The effect of the RF pulse is to move the time origin. A 180° refocusing pulse is appended to the end of the RF pulse. In addition to providing a spin-echo, this pulse will also reverse the magnetization along the z-axis. However, if the $M_{des}(f)$ profile is rotated by 180° before the SLR pulse design, this will correct for the effect of the refocusing pulse. The 180°-rotation is along the same axis as the refocusing pulse.

If TE=TR/2, then $M_{ss}$ ($\Delta f$) is periodic with a period of 2/TR. It follows that the RF pulse will be discretized with a period of TR/2.

As previously discussed, for a large range of off-resonance frequencies, the real-valued eigenvalue is often close to I and the angle between $M_{ss}$ and $v_r$ is very small. In this case, the direction pulse simply attempts to rotate $M_I$ to the direction of $M_{ss}$.

We apply the design methods described above to design a catalyzing sequence for refocused SSFP imaging. We compare this catalyzing sequence to a previous method described by Deimling and Heid, both in simulations and by implementing them on an MR scanner.

Deimling and Heid, "Magnetization Prepared True FISP Imaging," Proceedings of the 2nd Annual Meeting of SMR, San Francisco, 1994, p. 495, presented a simple method that greatly reduces oscillation in the transient response of refocused SSFP imaging sequences. The method consists of simply adding an additional RF pulse that precedes the first $\alpha$-tip of the SSFP sequence by a time of TR/2. This RF pulse rotates the magnetization non-selectively through an angle of $\alpha/2$. The axis of rotation is chosen such that the spins at a certain frequency (where signal is high) are tipped very close to their equilibrium position. This is referred to herein as the Deimling-Heid pulse sequence.

In a typical SSFP sequence, the axis of rotation of the RF pulses is cycled by $\pi$ radians on each tip so that on-resonant spins are in the center of the passband of the SSFP spectral response. To simplify analysis here, all pulses in the SSFP sequence are about the same axis, and the center of the SSFP passband is actually at an off-resonant frequency of ½ TR. The flip of the catalyzing pulse in the sequence presented by Deimling and Heid is adjusted to be $\pi/2$ out of phase from the other tips accordingly.

Figure 7:
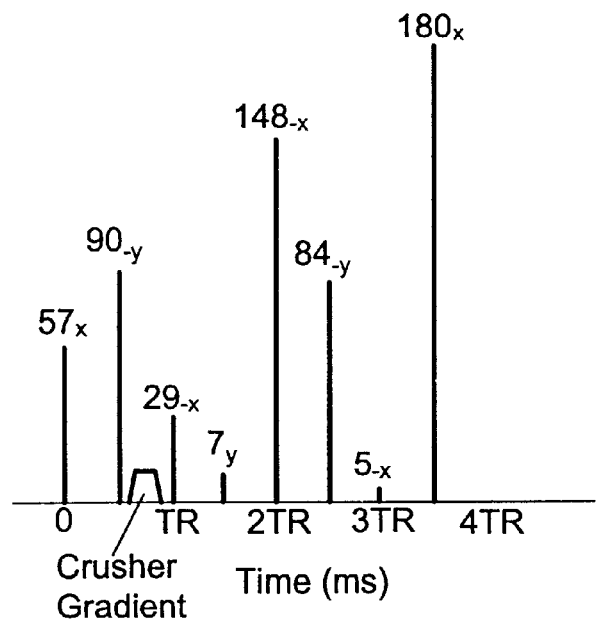
FIG. 7 illustrates a spectrally-selective catalyzing sequence based on eigenvector analysis.

A spectrally-selective catalyzing sequence was designed for tissue with $T_{1=2000}$ msec and T2=1300 msec, using the magnitude-scaling and direction-selection methods described above. The resulting pulse has a total duration of 4TR, including the spin-echo, as shown in FIG. 7, which is a spectrally-selective catalyzing sequence based on eigenvector analysis. The first two pulses perform magnitude-scaling, while the remainder serve to selectively tip the magnetization to the desired direction. The flip angle in degrees is shown for each pulse, along with the axis of the tip in a rotating coordinate frame.

The transient response of the SSFP sequence was simulated for a species of $T_1$=2000 msec, $T_2$=1300 msec. Simulations were performed for a SSFP sequence with no catalyzation, with the catalyzing sequence used by Deimling and Heid, and finally with our spectrally-selective method.

A 3D SSFP sequence with options for both catalyzing schemes described above was implemented on a GE Signa 1.5 T scanner with CV/i gradients (up to 40 mT/rn and 150 T/m/sec slew rates). Experiments were performed using a 500 ml bottle of spring-water (Crystal Geyser) with relaxation times $T_1$ and $T_2$ of 2000 msec and 1300 msec respectively. The bottle was placed with its longitudinal axis along that of the scanner, to reduce susceptibility artifacts. A quadrature transmit/receive head coil (GE Medical Systems) was used to provide relatively good $B_1$ homogeneity. The sequence used gradient amplitudes up to 40 mT/rn gradients and slew rates up to 120 T/m/sec.

Figure 8:
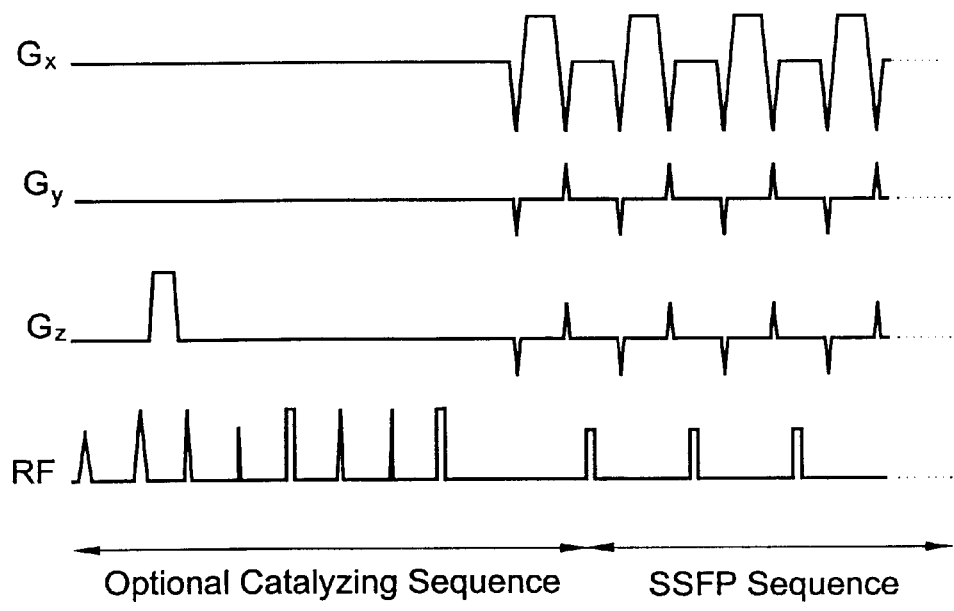
FIG. 8 illustrates a pulse sequence in accordance with an embodiment of the invention.

The SSFP sequence, as shown in FIG. 8, used non-selective RF-pulses with 60° tip angle, with the tip applied about the x-axis in the rotating frame. The first two pulses, followed by the Gz crusher, establishes the magnitude scaling. These two pulses can be replaced by SLR pulses. The pulses following the crusher are a SLR sequence for direction selection. This is followed by the SSFP read-out sequences. Images were acquired using TR=8 msec and TE=4 msec. A 2 msec readout along the axis of the bore was used, with phase-encoding in the other two directions for a voxel size of 0.5×8 x 8 mm$^3$. A linear (shim) gradient was applied along the longitudinal axis to produce a frequency variation of approximately 3 Hz/mm, or 1.5 Hz/pixel.

To record the transient response, phase encode gradients were kept constant for 256 repetitions of the SSFP sequence (preceded by an optional catalyzing sequence). This was followed by a 12 sec recovery time to allow magnetization to return to equilibrium before the next phase encode was acquired. The experiment was repeated three times: first with no catalyzing sequence, next with the sequence used by Deimling and Heid, supra, and finally with the catalyzing sequence presented here.

For each of 3 catalyzing options, and for each of 256 repetitions, 3D images were reconstructed using a custom reconstruction program. The image data were then rearranged to view the transient response for individual voxels along the longitudinal axis. The frequency corresponding to each voxel was determined using the phase of the signal from the first excitation of the uncatalyzed SSFP sequence.

The same refocused SSFP sequence was used to show the effects of the transient response in 2D images. After an optional catalyzing sequence, the y-axis phase encode was incremented on each excitation, but the z-axis phase encode was kept constant. After a 12 sec recovery time, the catalyzing sequence and y-axis phase encodes were repeated for a different z-axis phase encode. Images were acquired for all three catalyzing options described above, and also for the case where 250 repetitions were applied instead of a catalyzing sequence. In all cases, a small gradient lobe in the direction of the readout was used to simulate off-resonance. For each TR/2, a gradient lobe was included, to give a 4 Hz/mm or 1.6 Hz per pixel in the readout direction.

Figure 9A:
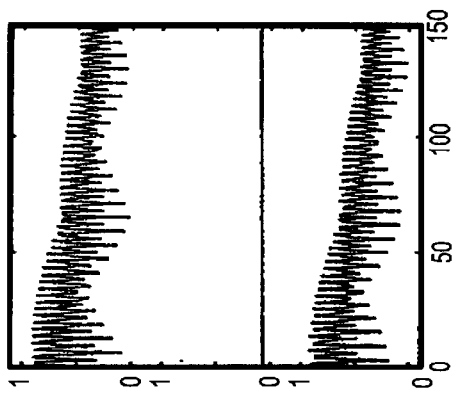
FIGS. 9a–9e illustrate simulated transient responses.
Figure 9B:
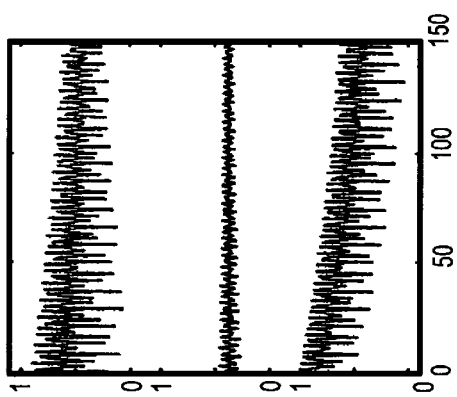
Figure 9C:
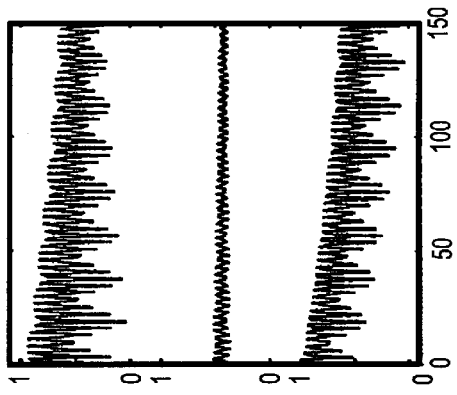
Figure 9D:
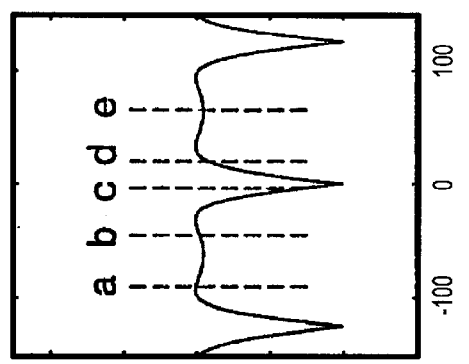
Figure 9E:
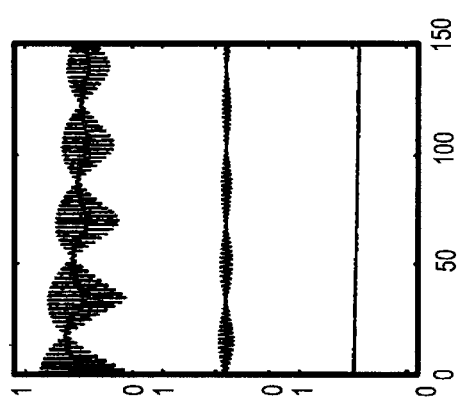
Figure 9F:
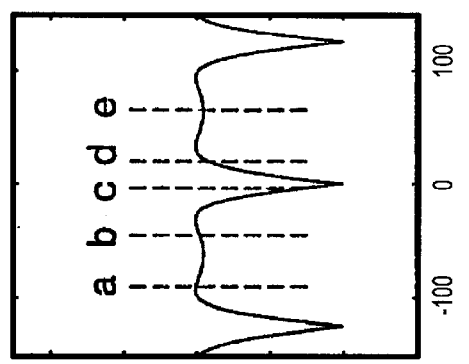
FIG. 9f illustrates positions of five frequencies in FIGS. 9a–9e.

All results are shown for SSFP sequences with no catalyzation, with the catalyzation method presented by Deimling and Heid, and with the catalyzing method described here. FIGS. 9a–9f show the simulated transient response for the three cases at five different off-resonant frequencies. The periodic spectral SSFP response in FIG. 9f shows the positions of each of the off-resonant frequencies. In each of FIGS. 9a–9e, the transient response is shown for standard SSFP (top), SSFP with our catalyzing method (middle) and SSFP with the Deimling and Heid method (bottom). The simulated steady-state signal plotted as a function of frequency (f) shows the positions of the five frequencies of the other plots.

FIGS. 10a–10f show the transient response for the same three cases measured experimentally.

In simulations and experimentally, both catalyzing methods perform well for frequencies around 62 Hz, corresponding to 0.5/TR. For frequencies around 0 Hz or ±125 Hz, where the nulls in the spectral response occur, the oscillations are large and slow to decay when Deimling and Heid's method is used, or when no catalyzation is used. For frequencies around −62 Hz, our catalyzing method demonstrates significantly reduced transients compared to Deimling and Heid's method. This is because the non-selective catalyzing scheme tips magnetization in the correct direction for only one half of the resonant species, and in the wrong direction for the other half.

The transient effects of both catalyzing schemes are very similar between the simulations and the experimental results. A major difference between the simulations and the experimental results is that the oscillations in experimental transient responses die out more quickly. This effect can be attributed to the frequency variation of a single voxel with a small gradient applied. Consider the monochromatic response to be an oscillation superimposed on a low frequency decay. The frequency of the oscillation increases with resonant frequency, but both the low frequency decay and the direction of the magnetization are less sensitive to resonant frequency. When the signals from a range of frequencies are summed with a sin(x)/x weighting to form a voxel as done by the discrete Fourier Transform, the resulting effect is a rectangular windowing or weighting on the oscillatory component, causing it to die out more quickly. We have tested this effect by varying the voxel size along the direction of the shim gradient and noting that the transient oscillations die out in a time inversely proportional to the voxel size (and thus the frequency variation over a voxel).

Images acquired using the same three options are shown in FIG. 11 including (a) no transient response reduction method, (b) the spectral catalyzing scheme presented, (c) the catalyzing scheme presented by Deimling and Heid, and (d) 250 excitations to establish steady-state prior to imaging. The readout and phase encode directions are as shown. A small additional gradient causes the resonant frequency to vary with position, about 4 Hz/mm over the 20 cm field-of-view. A fourth image shows the result when all imaging is done after a steady-state has been reached by waiting enough excitations before acquisition. As with the transient response plots, we see that Deimling and Heid's sequence performs well for one half of the resonant frequencies, but not for the other half. Image artifacts are severe around regions where the steady-state signal nulls occur when no catalyzation is used as well as when the Deimling and Heid method is used. The spectrally-selective catalyzing technique eliminates all artifacts and produces images that are very similar to images obtained after the steady-state has been obtained naturally. The darker region at the right side of the image in FIG. 11 is most likely due to the $B_1$-sensitivity of this method, described infra.

There has been presented a linear-systems analysis of the transient response for steady-state sequences. From this analysis we have designed a catalyzing sequence that reduces both oscillations and exponential decay in the transient response. The results show that the theory that we have presented is applicable to real imaging sequences.

Our method uses two stages, magnitude scaling and direction selection. A magnitude-scaling pulse performs a frequency-selective partial-saturation to scale the magnetization close to its steady-state length. The direction selection pulse then manipulates the magnetization to the appropriate direction for its frequency. The overall sequence attempts to simultaneously catalyze the transition to steady-state for all resonant frequencies.

To illustrate the robustness of this method, we can quantify the amplitude of transient oscillation as a fraction of the passband signal magnitude, as a parameter is varied. For our catalyzing method, the oscillation was calculated for frequencies varying over a full period of off-resonant frequency using simulations and $T_1/T_2$=2000/1300 msec. The mean, standard deviation and maximum oscillation amplitudes as fractions of the signal were 8.4%, 5.0% and 16.8% respectively. These numbers are significantly lower than those calculated for the same case but without a catalyzing sequence: A mean, standard deviation and maximum of 92%, 24% and 111% respectively.

In designing a catalyzing sequence, we choose one combination of $T_1$ and $T_2$. Two properties allow such a sequence to be useful. First, in steady-state sequences, the species with shorter relaxation times have a shorter transient response and do not need catalyzing. Second, the eigenvector directions tend to be much less sensitive to relaxation times than they are to frequency. It follows that the transient response is smooth even where the scaled magnetization length is very different from the steady-state length for a given combination of relaxation times. We simulated the initial oscillation magnitude for 200 msec $<T_1$, $<3000$ msec, $0.1T_1<T_2<0.9T_1$ and over all frequencies using our catalyzing sequence. The mean, standard deviation and maximum values of the oscillation as a fraction of the passband signal were 7.9%, 4.6% and 17% respectively, showing that the method is not very sensitive to $T_1$ and $T_2$ variation.

Design of frequency-selective pulses is partly an art. The ideal trade-off between pulse duration and accuracy of the profile will probably depend on the application, and on the relaxation times. We have shown a fairly structured approach using the SLR algorithm, which can be used to design both the magnitude-scaling and direction-selection pulses (although the magnitude-scaling pulse we tested was a simpler design.)

One problem that we have not approached is the sensitivity of catalyzing sequence to $B_1$ variation. In the sequence presented by Deimling and Heid, the catalyzing tip angle is one half of the tip angle used in the standard sequence. Thus this method will be insensitive to $B_1$ variation. Our method, on the other hand, is quite sensitive to errors in $B_1$ of more than about ±5%. For B, variations of ±5%, the initial oscillation was calculated over the complete frequency range. The oscillation as a fraction of signal has a mean, standard deviation and maximum of 15.6%, 10.2% and 35%. It is probably possible to reduce this sensitivity to $B_1$ variations with more careful pulse design. However, our purpose was to test the theory presented here, leaving the design of more practically useful pulses to future work.

The catalyzing method that we have shown is based entirely on free precession, like the signal in a refocused SSFP sequence. In steady-state sequences where gradient pulses are not completely rewound, the same catalyzing method can still be used, providing that the phase accrual due to gradients in the catalyzing sequence appropriately mimics that of the steady-state sequence. As an example, our sequence can be used in gradient-recalled acquisition in steady-state (GRASS) sequences. Each RF pulse in the catalyzing sequence would be followed by a gradient with 50% of the area of the spoiler pulse used in the GRASS sequence for gradient spoiling. This corresponds to the fact that in our catalyzing sequence, precession was over TR/2, and thus half of the precession in a single period of the steady-state sequence. Simulations show that this can eliminate the transient artifacts in images from GRASS sequences, as well as a variety of other steady-state sequences such as fluctuating equilibrium MR.

The magnitude scaling part of this sequence is useful when a particular tissue of interest will have a steady-state magnetization lower in magnitude than its initial magnetization. This is frequently the case—except in cases where the initial magnetization is actually a different steady-state. However, magnitude scaling is also very useful because it suppresses the signal at frequencies where the amount of oscillation is large. We have simulated magnitude scaling followed by Deimling and Heid's sequence and also followed by the ramped pulse method presented by Nishimura and Vasanawala in "Analysis and reduction of the transient response in SSFP imaging," Proceedings of the 8th Annual Meeting of ISMRM, Denver, 2000 referred to herein as the Nishimura-Vasanawala pulse sequence. In both cases, the magnitude scaling significantly reduces the amount of oscillation near the signal nulls.

Direction catalyzing has widespread application in situations where imaging during the transient response is useful. It may also be useful in catalyzing the transition between different steady states as in Vasanawala SS, Pauly JM, Nishimura Nishimura DG, "Linear combination steady-state free presession MRI," Magn. Reson Med 2000. A direction selection pulse will reduce transient oscillation, leaving an exponential transient signal magnitude that can be used in conjunction with other preparatory sequences to obtain desirable contrast.

The transient response of steady-state sequences can be a limiting factor on scan time, or can otherwise cause artifacts in images. For arbitrary steady-state sequences, the transient response can be viewed as a zero-input, third-order system response, where the system is described by a single 3×3 matrix. The system matrix depends on all parameters of the sequence, as well as tissue parameters and resonant frequency. The eigenvalues and eigenvectors of the system matrix provide much insight into the nature of both the transient and the steady-state magnetization in the sequence. This insight allows intuitive design of "catalyzing" sequences that dramatically speed up the evolution of a steady-state. We have designed such a sequence. and successfully tested it using a phantom.

Our invention encompasses a number of variations in rotation or tipping including the Deimling and Heid tipping, supra, and Nishimura and Vasanawala, supra. Another variation is magnitude nulling using the described magnitude scaling sequence but without a rotation or βx tipping pulse. These variations are illustrated in FIGS. 12–20 which illustrate the detected signal magnitude at several frequencies (−90 Hz to +61 Hz) for realizing the shady state condition illustrated in the lower right box in each figure.

Figure 12:
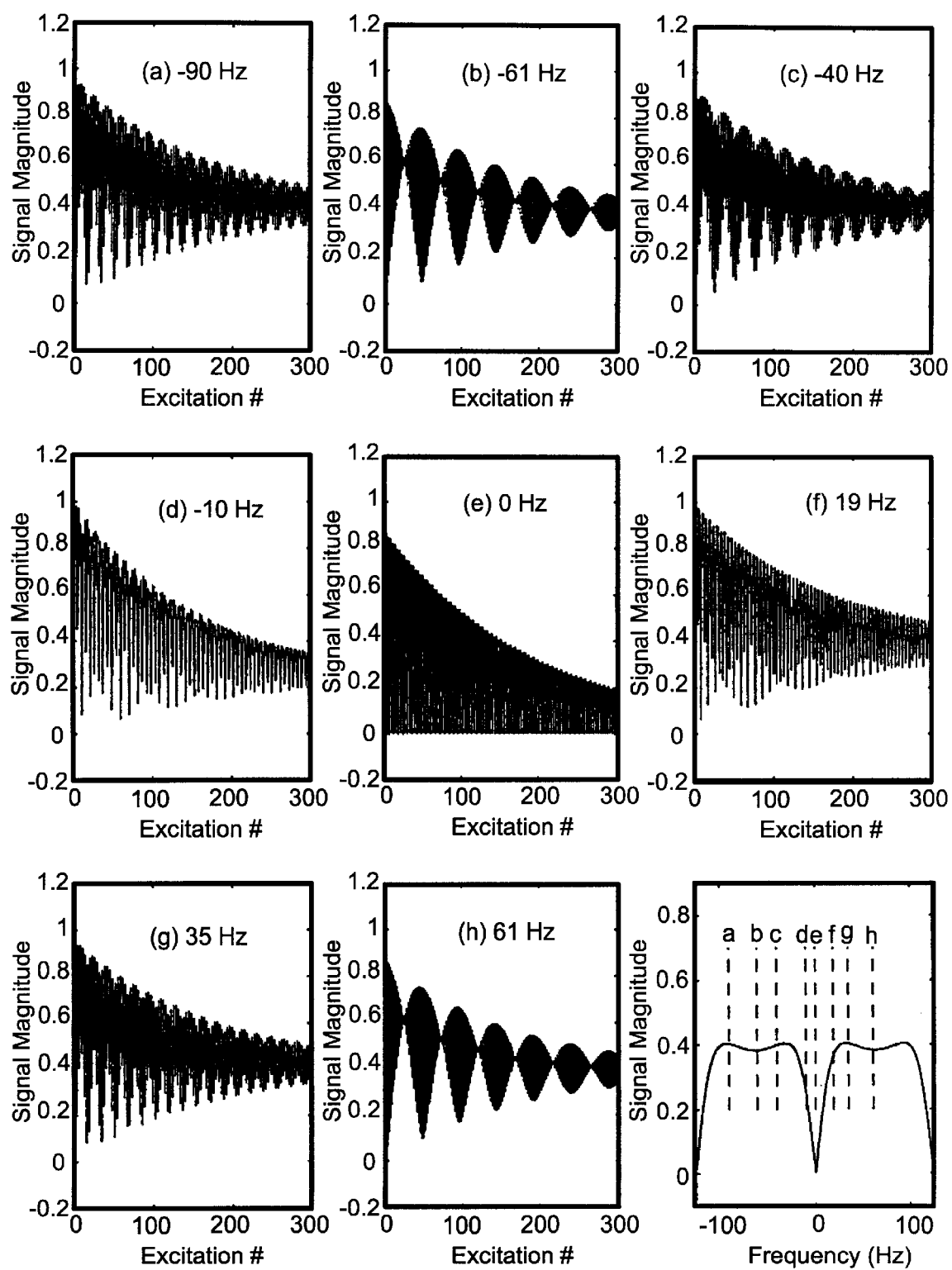
FIGS. 12–20 illustrate detected signals without catalyzing and with catalyzing in accordance with different embodiments of the invention.
Figure 13:
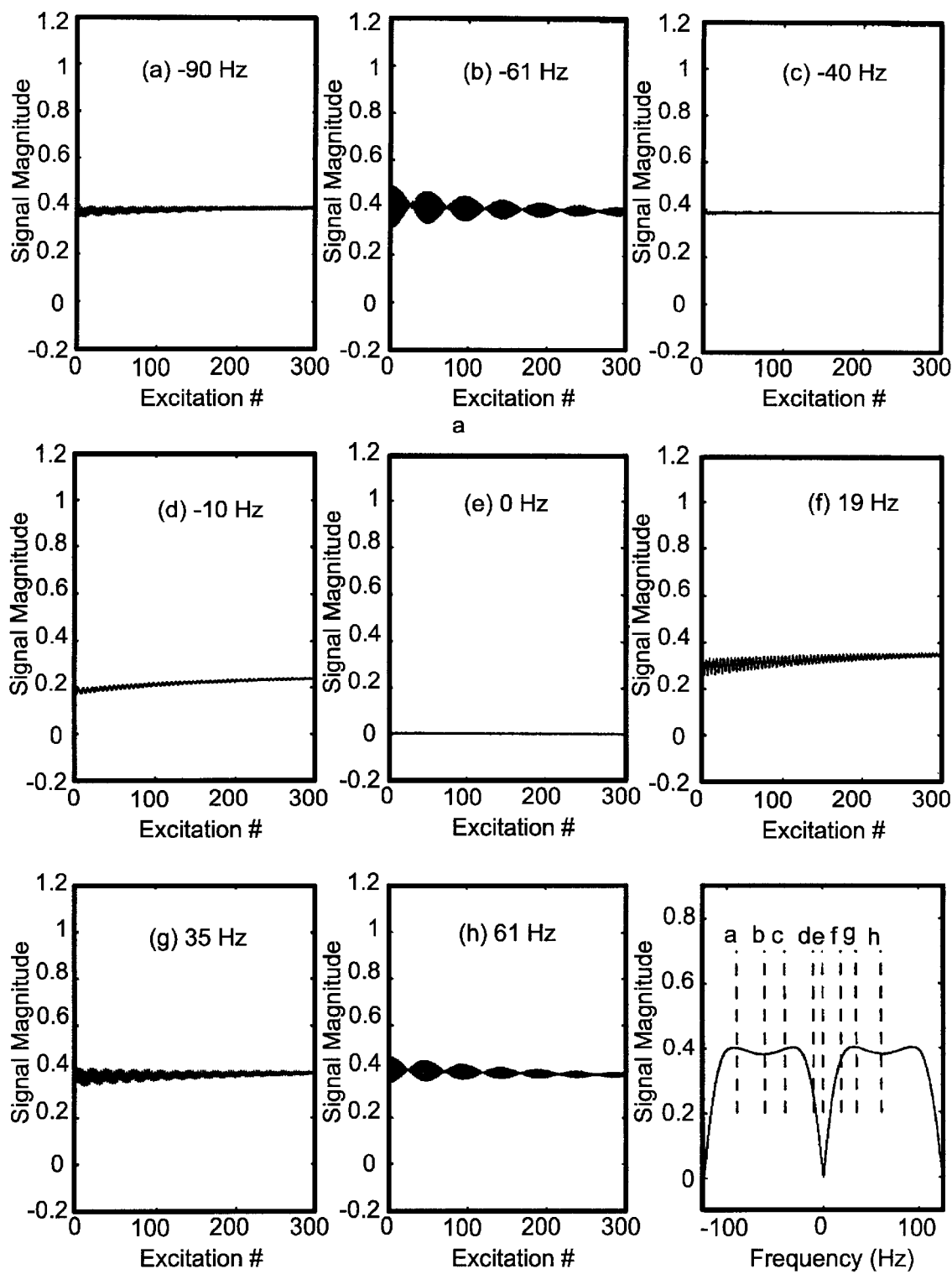

FIG. 12 illustrates the detected signals at −90 Hz, −61 Hz, −40 Hz, −10 Hz, 0 Hz, 19 Hz, 35 Hz, and 61 Hz in a refocused SSFP with no catalyzing sequence. Major oscillations are seen in the signal at all frequencies.

Figure 14:
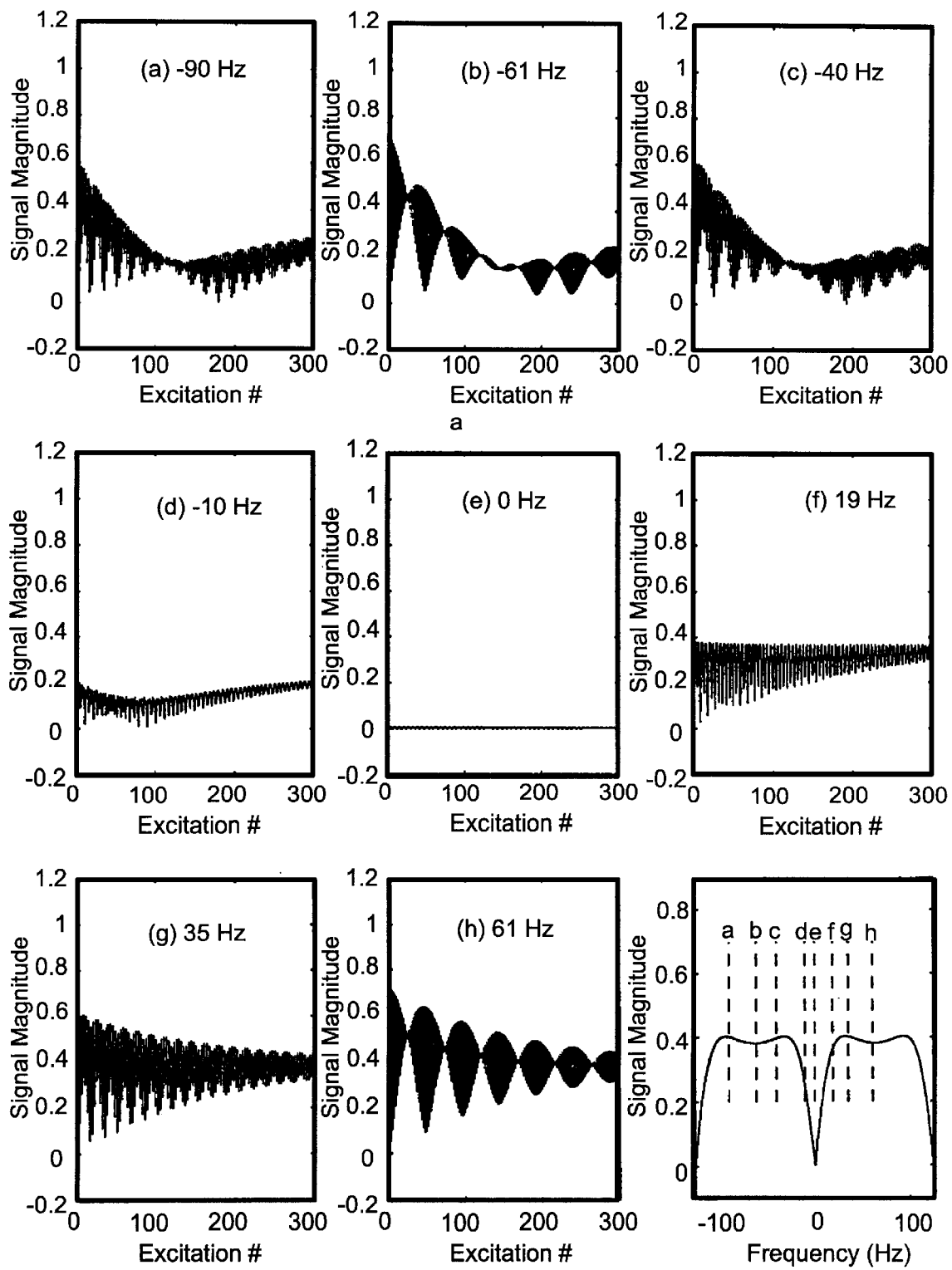
Figure 15:
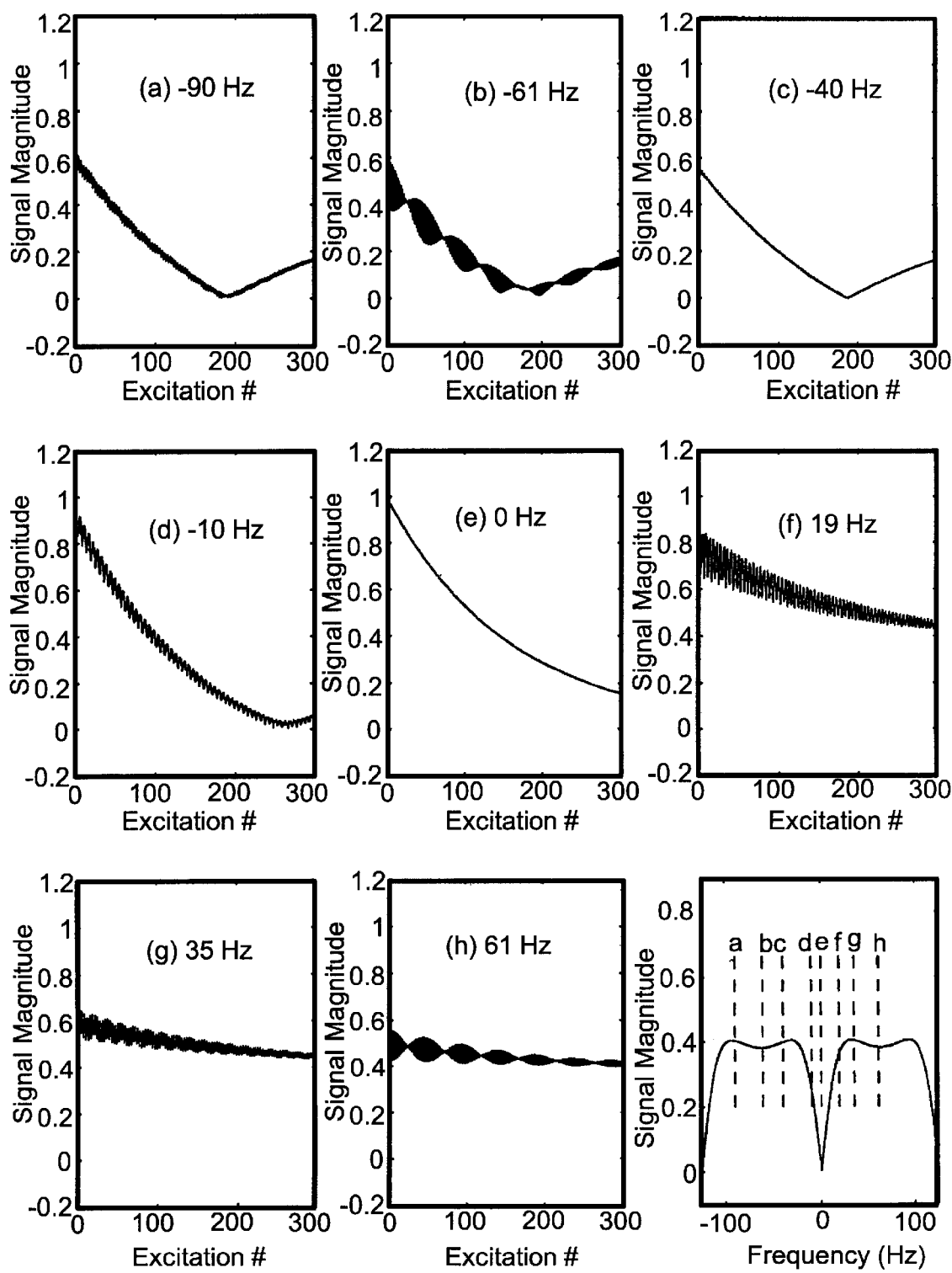

Contrast FIG. 12 with the spectral magnitude scaling and direction selection in accordance with the invention as described above as shown in FIG. 13. Very small or no oscillations are present. FIG. 14 illustrates signals with magnitude scaling only using a βx–TR/2–90y—spoil sequence, which is an improvement over FIG. 12 but still with considerable oscillation. FIG. 15 illustrates signals with direction selection only and in which oscillation damping is much improved over FIG. 14.

Figure 16:
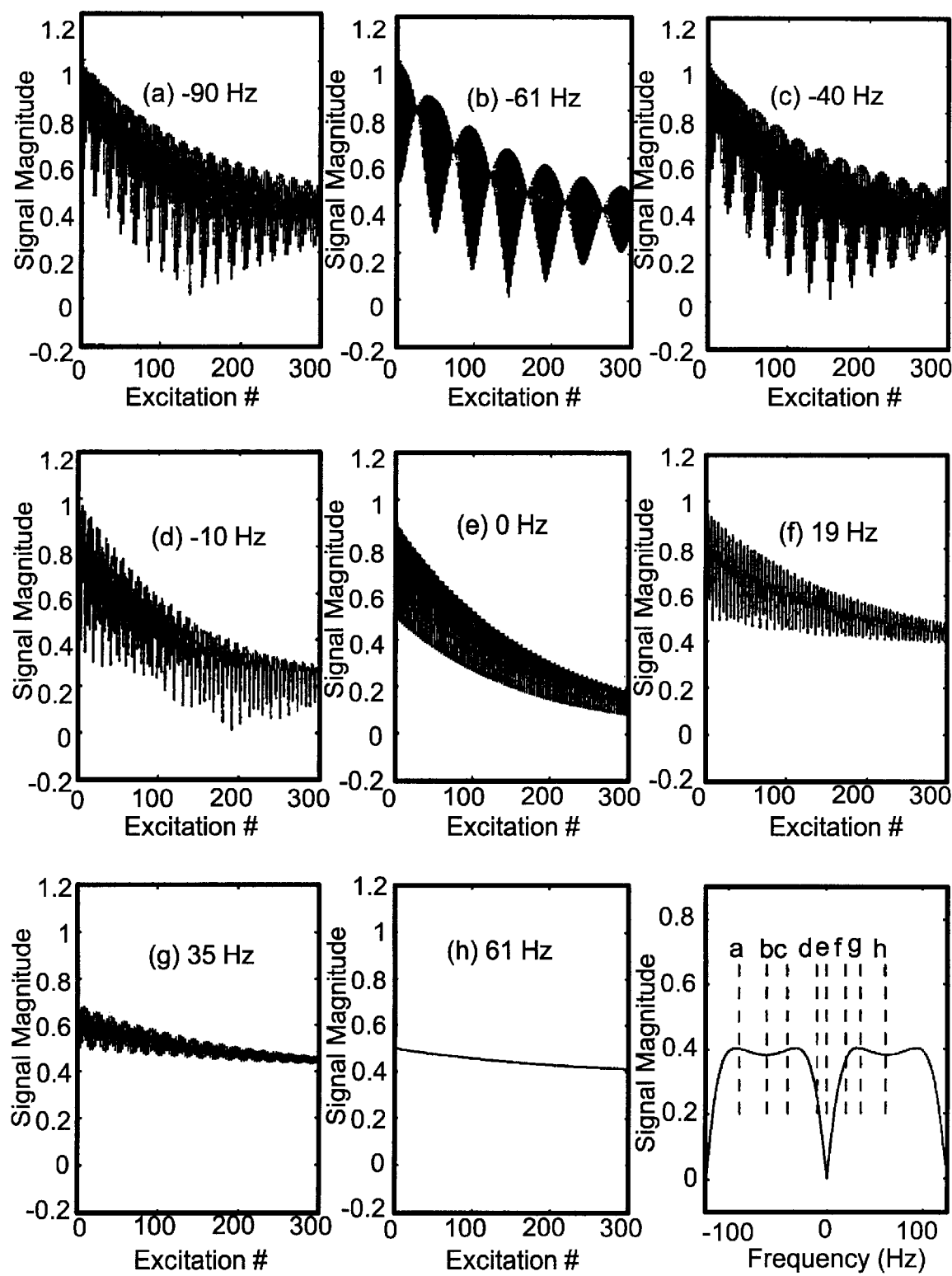
Figure 17:
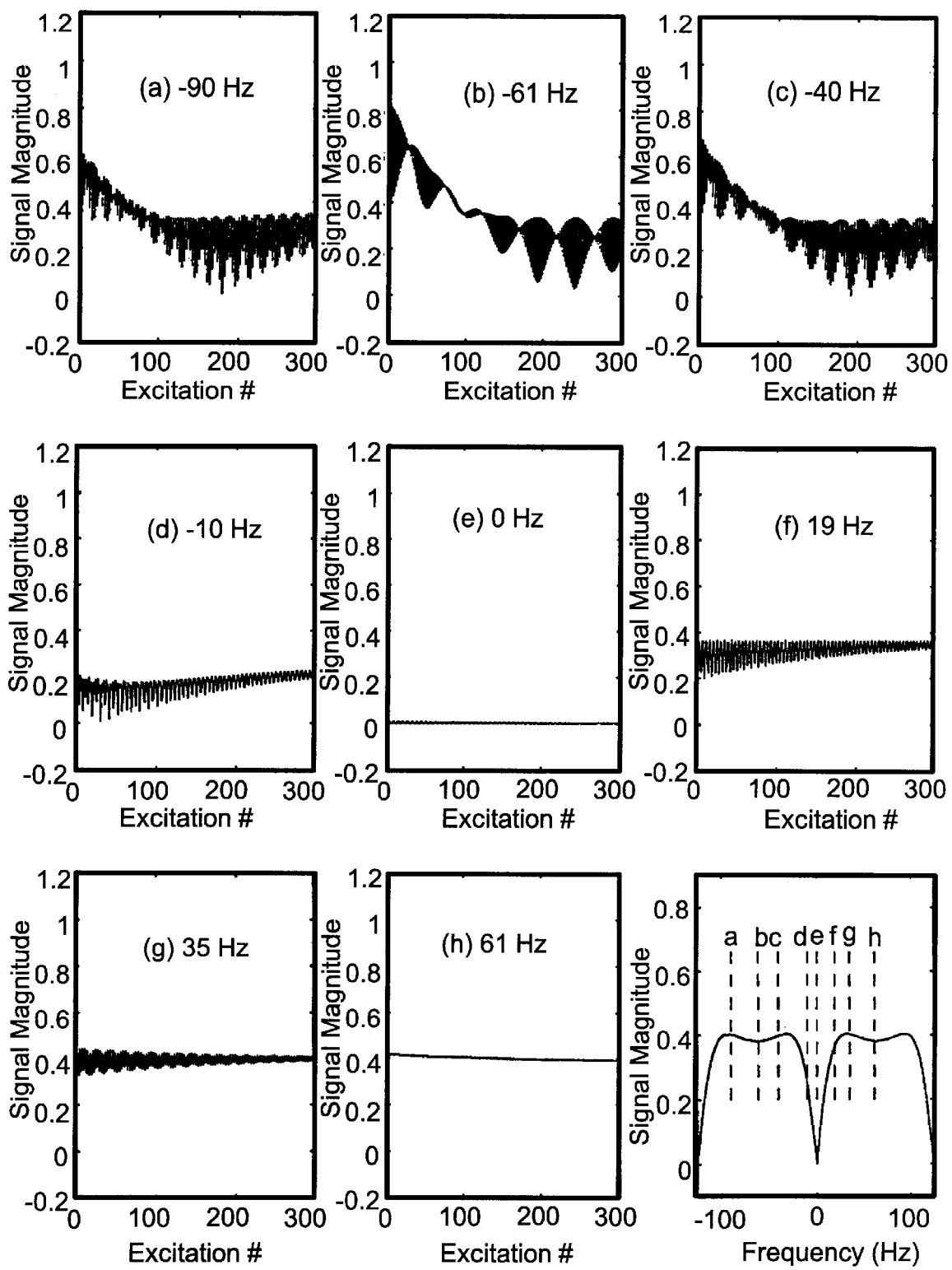

The Deimling half-tip half TR method provides the resulting signals of FIG. 16, by using an β/2y–TR/2 sequence, and combining the Deimling tipping method with scaling, in accordance with an embodiment of the invention, as illustrated in FIG. 17 greatly enhances the signals as compared to FIG. 16.

Figure 18:
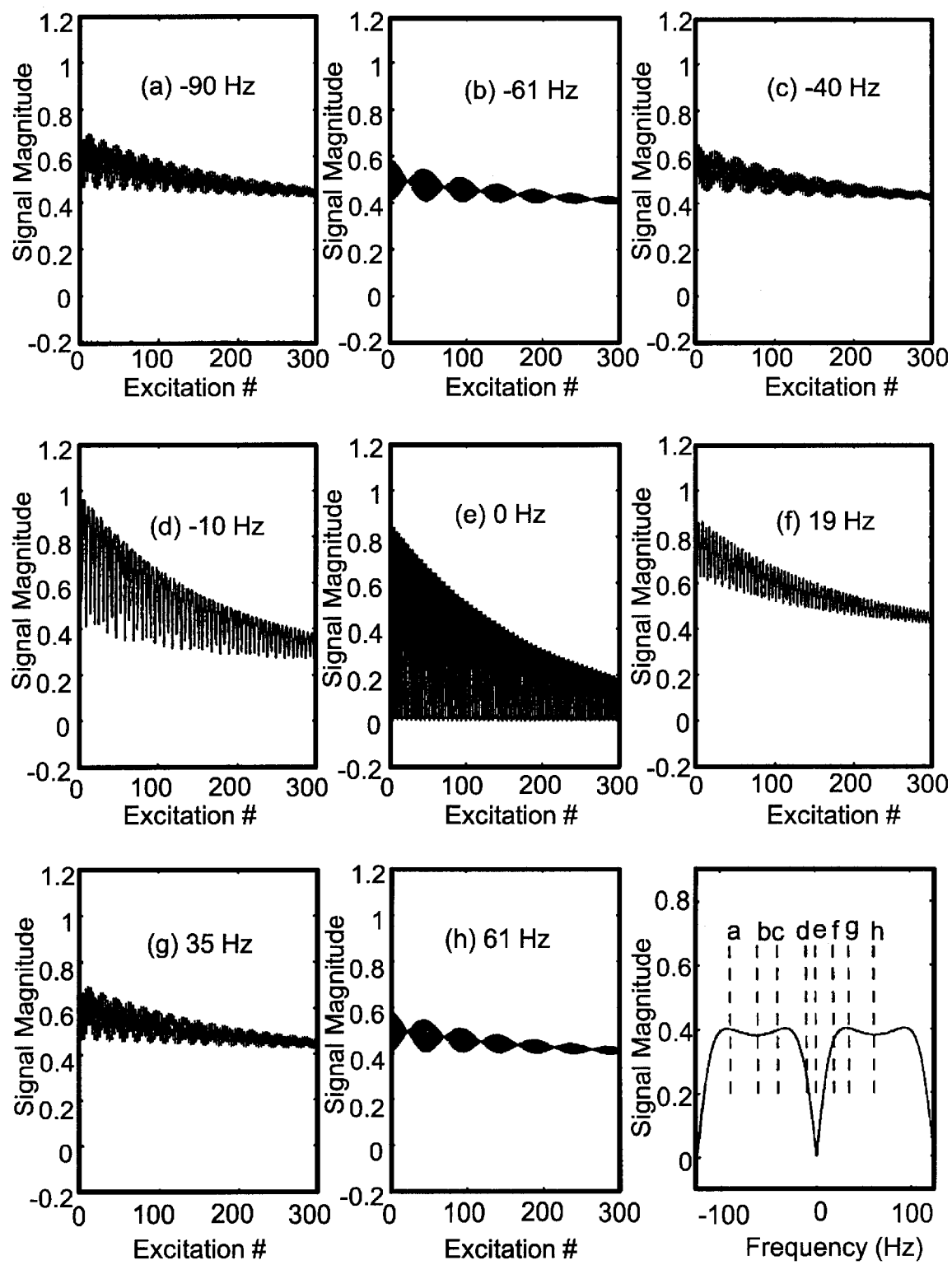
Figure 19:
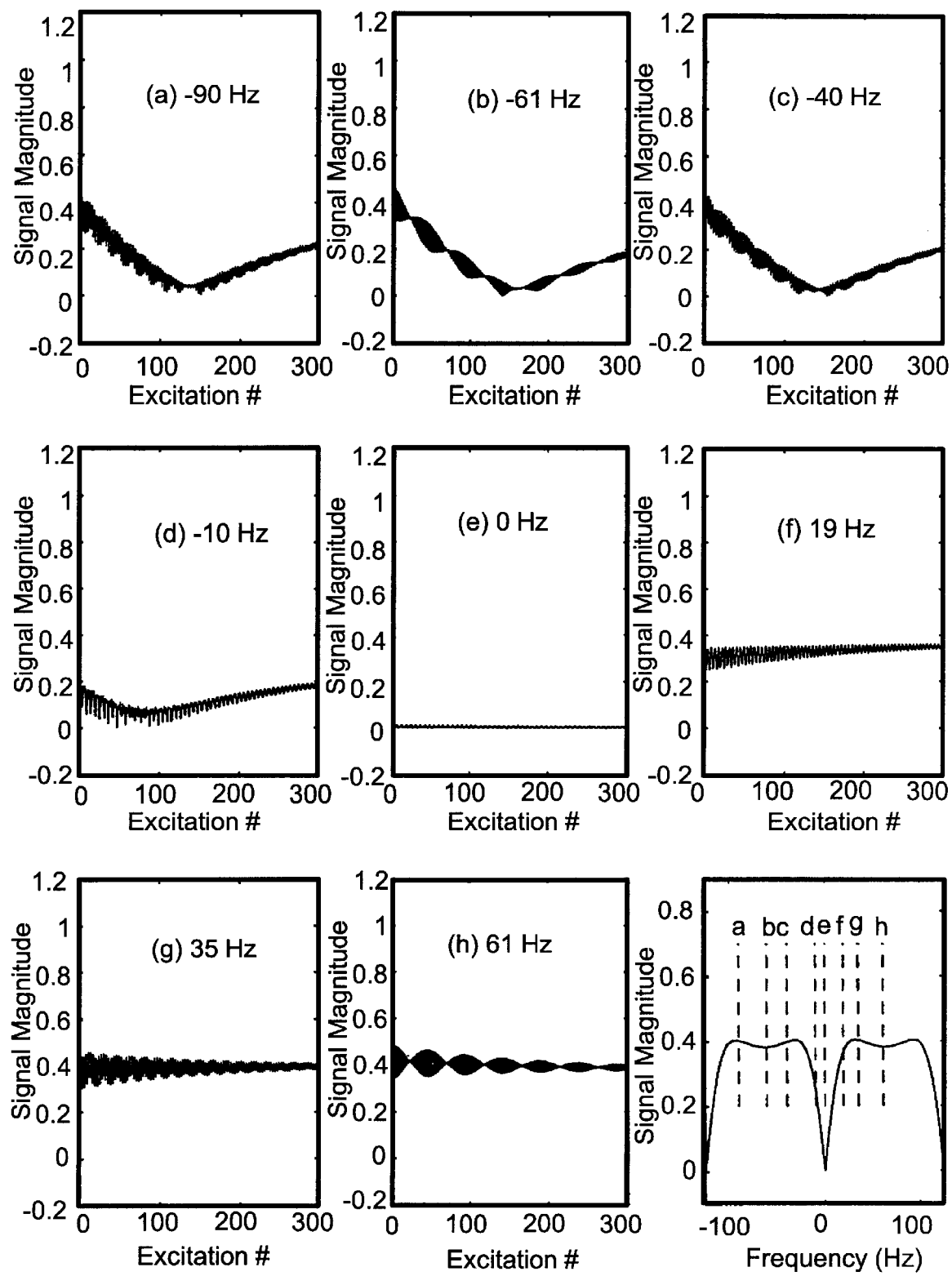

Similarly, the Nishimura and Vasanawala tipping method alone provides signals shown in FIG. 18, using tip pulses with smoothly increasing amplitudes such as 0.2 $\alpha_x$–TR–0.4 $\alpha_x$–TR–0.6 $\alpha_x$–TR–0.8 $\alpha_x$–TR–$\alpha_x$–TR, but when combined with scaling, in accordance with another embodiment of the invention, as illustrated in 19 greatly enhances the signals as compared to FIG. 18.

Figure 20:
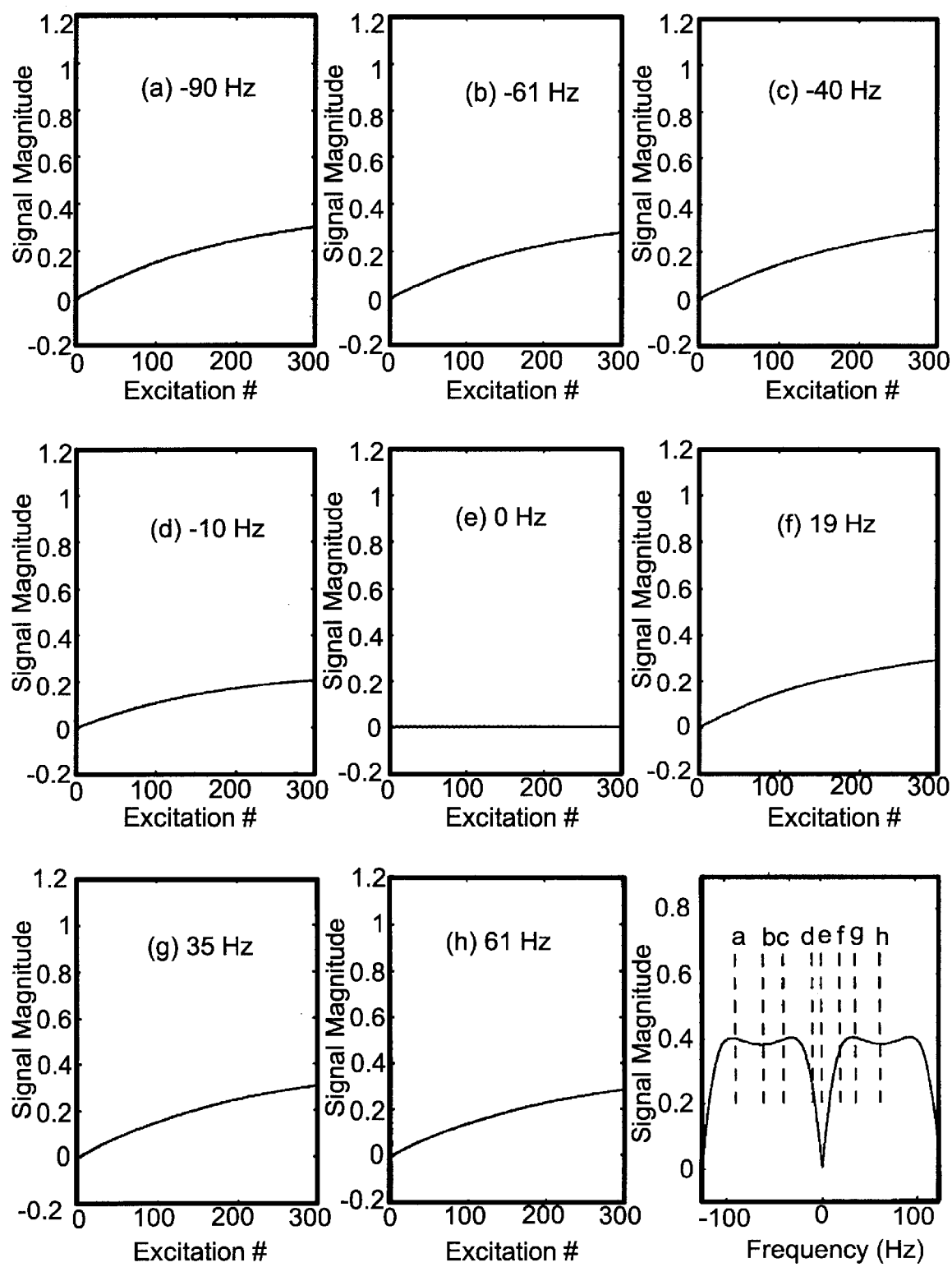

FIG. 20 illustrates the resulting signals when magnitude nulling alone, without tipping, is employed in accordance with another embodiment of the invention. Signal magnitude is adversely affected, but the signals have no oscillations.

Thus, while the invention has been described with reference to specific embodiments, the description is illustrative of the invention and is not to be construed as 17(t limiting the invention. Various modifications and applications may occur to those skilled in the art without departing from the true spirit and scope of the invention, as defined by the appended claims.

What is claimed is:

1. In magnetic resource imaging, a method for catalyzing a steady-state condition for tipped nuclear spins comprising the steps of:
   a) determining magnetization magnitude of the steady-state condition ($M_{ss}$),
   b) scaling magnetization along an axis (Mz) to at least approximate the determined magnetization magnitude, and
   c) rotating the scaled magnetization ($M_{des}$) to coincide substantially with a real-valued eigenvector extension of the tipped steady-state magnetization ($M_{ss}$), whereby any error vector will decay to the steady-state condition ($M_{ss}$) with reduced oscillation.

2. The method as defined by claim 1 wherein step a) magnetization magnitude is determined by solution of the equation $$M_{ss}=(I-A)^{-1}B$$

where I is a 3×3 identity matrix
   A is a 3×3 matrix
   B is a 3×1 vector, and
   A and B are functions of relaxation times $T_1$ and $T_2$ and pulse sequence parameters.

3. The method as defined by claim 2 wherein in step c) the extension is a real-valued eigenvector of the matrix A.

4. The method as defined by claim 1 wherein step b) is performed by a multiple pulse sequence which establishes the scaled magnetization along an axis ($M_z$) followed by a crusher gradient to eliminate magnetization along other axes.

5. The method as defined by claim 4 wherein step c) is performed by a Shinnar-LeRoux pulse sequence.

6. The method as defined by claim 1 wherein step b) and step c) are performed by Shinnar LeRoux pulse sequences.

7. The method as defined by claim 1 wherein step c) is performed by a Shinnar LeRoux pulse sequence.

8. The method as defined by claim 1 wherein the magnetic resonance imaging utilizes steady-state free precession (SSFP) read-out sequences.

9. The method as defined by claim 8 and further including the steps of applying read-out magnetic gradients while detecting magnetic resonance signals from the tipped nuclear spins.

10. The method as defined by claim 1 and further including the steps of applying read-out magnetic gradients while detecting magnetic resonance signals from the tipped nuclear spins.

11. The method as defined by claim 1 wherein step c) comprises a Deimling-Heid rotation pulse sequence.

12. The method as defined by claim 1 wherein step c) comprises a Nishimura-Vasanawala rotation pulse sequence.

13. For magnetic resonance imaging, a method for catalyzing a steady-state condition for tipped nuclear spins comprising the steps of:
   a) determining magnetization magnitude of the steady-state condition ($M_{ss}$), and
   b) scaling magnetization along an axis (Mz) to at least approximate the determined magnetization magnitude.

14. The method as defined by claim 13 wherein step a) magnetization magnitude is determined by solution of the equation $$M_{ss}=(I-A)^{-1}B$$

where I is a 3×3 identity matrix
   A is a 3×3 matrix
   B is a 3×1 vector, and
   A and B are functions of relaxation times $T_1$ and $T_2$ and pulse sequence parameters.

15. The method as defined by claim 14 wherein in step c) the extension is a real-valued eigenvector of the matrix A.

16. The method as defined by claim 13 wherein step b) is performed by a multiple pulse sequence which establishes the scaled magnetization along an axis ($M_z$) followed by a crusher gradient to eliminate magnetization along other axes.

17. The method as defined by claim 13 wherein step a) is performed by a Shinnar-Le Roux pulse sequencer.

18. The method as defined by claim 13 wherein the magnetic resonance imaging utilizes steady-state free precession (SSFP) read-out sequences.

19. The method as defined by claim 18 and further including the steps of applying read-out magnetic gradients while detecting magnetic resonance signals from the tipped nuclear spins.

20. In magnetic resonance imaging a method for catalyzing a steady-state condition for tipped nuclear spins comprising the steps of:
   a) determining by eigenvector analysis a real-valued eigenvector for the tipped nuclear spins, and
   b) rotating a scaled magnetization ($M_{des}$) to coincide substantially with the real-valued eigenvector extension of the tipped steady-state magnetization ($M_{ss}$), whereby any error vector will decay to the steady-state condition ($M_{ss}$) with reduced oscillation.

21. The method as defined by claim 20 wherein the real-valued eigenvector is determined by eigenvector analysis of the equation $$M_{ss}=(I-A)^{-1}B$$

where I is a 3×3 identity matrix
   A is a 3×3 matrix
   B is a 3×1 vector, and
   A and B are functions of relaxation times $T_1$ and $T_2$ and pulse sequence parameters.

22. The method as defined by claim 21 wherein in step b) the extension is a real-valued eigenvector of matrix A.

23. The method as defined by claim 21 wherein step b) is performed by Shinnar-Le Roux pulse sequence.

24. The method as defined by claim 23 wherein the magnetic resonance imaging utilizes steady-state free precession (SSFP) read-out sequence.

25. The method as defined by claim 24 and further including the steps of applying read-out magnetic gradients while detecting magnetic resonance signals from the tipped nuclear spins.

26. The method as defined by claim 20 wherein step b) comprises a Deimling-Heid rotation pulse sequence.

27. The method as defined by claim 20 wherein step b) comprises a Nishimura-Vasanawala rotation pulse sequence.

* * * * *

UNITED STATES PATENT AND TRADEMARK OFFICE
CERTIFICATE OF CORRECTION

PATENT NO. : 6,452,387 B1
DATED : September 17, 2002
INVENTOR(S) : Hargreaves et al.

It is certified that error appears in the above-identified patent and that said Letters Patent is hereby corrected as shown below:

<u>Title page,</u>
Item [75], Inventors, "Brain A. Hargreaves" should be -- Brian A. Hargreaves --.

Signed and Sealed this

Twenty-sixth Day of August, 2003

JAMES E. ROGAN
*Director of the United States Patent and Trademark Office*